(12) United States Patent
Inoue

(10) Patent No.: US 6,657,225 B1
(45) Date of Patent: Dec. 2, 2003

(54) SEMICONDUCTOR COMPONENT, ACTIVE MATRIX SUBSTRATE FOR A LIQUID CRYSTAL DISPLAY, AND METHODS OF MANUFACTURING SUCH COMPONENT AND SUBSTRATE

(75) Inventor: Satoshi Inoue, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/276,527

(22) Filed: Mar. 25, 1999

(30) Foreign Application Priority Data

Mar. 25, 1998 (JP) ............................................ 10-078147

(51) Int. Cl.⁷ .............................................. H01L 29/04
(52) U.S. Cl. ......................... 257/59; 257/401; 257/347; 257/618
(58) Field of Search ........................ 257/59, 72, 347, 257/401, 618, 784, 382, 64

(56) References Cited

U.S. PATENT DOCUMENTS

| | | | |
|---|---|---|---|
| 3,649,354 A | * 3/1972 | Te Velde | ............ 257/618 |
| 4,470,060 A | * 9/1984 | Yamazaki | ............ 257/61 |
| 5,847,413 A | * 12/1998 | Yamazaki et al. | ........ 257/69 |
| 5,949,102 A | * 9/1999 | Saida et al. | ......... 257/315 |
| 6,232,561 B1 | * 5/2001 | Schmidt et al. | ........ 257/784 |

* cited by examiner

Primary Examiner—Mark V. Prenty
(74) Attorney, Agent, or Firm—Oliff & Berridge, PLC

(57) ABSTRACT

In contrast to conventional semiconductor components formed on a silicon substrate, the present invention aims at providing a transistor component functioning as a semiconductor component by being placed on an insulating substrate made of plastic and the like. The transistor component according to the present invention comprises a silicon grain 100A with a drain area 402 and a source area 401 formed via a channel area 403, an oxidation film 101 covering the surface of the silicon grain 100A, a gate electrode 300A connecting with the channel area 403 via the oxidation film 101, and a drain electrode 200A electrically connecting with the drain area 402, and a source electrode 400A electrically connecting with the source area 401.

17 Claims, 18 Drawing Sheets

(A)

(B)

(C)

(A)

(B)

(A)

(B)

(C)

(A)

(B)

(A)

(B)

SEMICONDUCTOR COMPONENT, ACTIVE MATRIX SUBSTRATE FOR A LIQUID CRYSTAL DISPLAY, AND METHODS OF MANUFACTURING SUCH COMPONENT AND SUBSTRATE

BACKGROUND OF THE INVENTION

1. Field of the Invention

The present invention relates to a transistor component, particularly to a technique for obtaining a transistor component using a silicon grain. The present invention especially relates to a transistor component preferable for manufacture of large-size liquid crystal displays and the like.

2. Description of the Related Art

FIG. 11 is a planar view of an active matrix substrate in a conventional TFT (thin film transistor) liquid crystal display. A TFT is formed on each pixel area defined by data lines 31 and scan lines 15 on an insulating substrate 10.

As shown in FIG. 12(D), this TFT comprises a channel area 17 for forming a channel between a source area 14 and a drain area 16, a gate electrode 15 arranged opposite to the channel area 17 thereby sandwiching a gate insulation film 13, a source electrode 31 electrically connecting with the source area 14 via a contact hole 201 of a layer insulation film 20 formed on the surfaces of the channel area 17 and the source electrode 31, and a pixel electrode 40 made of a sputter ITO (indium thin oxide) film electrically connecting with the drain area 16 via a contact hole 202 of the layer insulation film 20. The source electrode 31 is here a portion of the data line, and the gate electrode 15 is a portion of the scan electrode. The same reference numerals have been indicated accordingly.

Conventionally, a TFT with the construction above was manufactured by the processes illustrated in FIG. 12. FIG. 12 is a cross-section of the conventional substrate in FIG. 11 taken along X—X. As shown in FIG. 12(A), a semiconductor film is formed on the surface of a base protection film 11 of an insulating substrate 10, the semiconductor film is then patterned, formed to an island-shape, and a gate insulation film 13 is formed thereon.

Next, a thin film of aluminum or the like is formed by sputtering and patterned to form a gate electrode 15. Scan lines are formed concurrently. The gate electrode 15 is used as the mask for introducing an impurity ion on the semiconductor film, to form a source area 14 and a drain area 16. Thereafter, the layer insulation film 20 is formed. As shown in FIG. 12(B), contact holes 201, 202 are formed, and a source electrode 31 electrically connecting with the source area 14 via the contact hole 201 is formed. As shown in FIG. 12(C), an ITO film is formed by sputtering on the surface of the source electrode 31, and then a resist mask 701 is used as a mask to pattern the ITO film to form a mask. Then, as shown in FIG. 12(D), the resist mask 701 is used as a mask to pattern the ITO film and form a pixel electrode 40.

As described above, during the manufacture of an active matrix substrate for a TFT liquid crystal display, the CVD (chemical vapor deposition) or PVD (physical vapor deposition) method was used to form a semiconductor film on the substrate. Therefore, when manufacturing a TFT display having a silicon substrate of an area of 1 $m^2$ or more, there was the problem that the device became bulky and the manufacturing cost increased.

As an alternative, compact silicon substrates could be combined to manufacture a TFT display with a large area, but the alignment would become complex, and the manufacture difficult.

On the other hand, recent efforts have been made to coat silicon solution on an insulating substrate and form a silicon film by removing the liquid, but even with this method, it is difficult to form a large-size silicon substrate. Accordingly, the conventional technique of forming transistor components and the like on a silicon substrate was not adequate in cases where large-size silicon substrates were required.

Another recent method liquidizes conductive material used for forming wiring, coating such liquid via an inkjet printer on the face for forming the wiring pattern, and blowing the solvent to form the wiring pattern. However, this problem had the issue that the step of forming the wiring pattern would be additionally necessary, etc.

SUMMARY OF THE INVENTION

In contrast to conventional semiconductor components formed on a silicon substrate, the present invention aims at providing a transistor component functioning as a semiconductor component by being quasi placed on an insulating substrate, and the method of manufacturing such transistor component.

The present invention further aims at providing an active matrix substrate for use with a large-size TFT liquid crystal display using the transistor component above, and a method of manufacturing such substrate.

The present invention still further aims at providing a semiconductor device enabling easy patterning of the wiring.

In order to solve the aims above, the semiconductor component relating to the present invention is formed by fixing a plurality of silicon microbulks (powder, grain or piece, etc.) on an insulating substrate in array, and using the silicon grains themselves as a channel layer of the transistor.

The present invention further uses the semiconductor component as the switching component for each pixel electrode of an active matrix substrate.

Furthermore, in the present invention, fine metal wires used for wire bonding in a conventional semiconductor device are used for the wiring pattern on the semiconductor component.

Also, the present invention is a semiconductor device having a contact hole in connection with a source area and a drain area of a semiconductor component, the contact hole being formed on an insulation film and formed of a cutout made by the insulation film being selectively cut by a fine cutting means.

The embodiment of the present invention described above comprises a silicon grain with a drain area and a source area formed via the channel area, an oxidation film covering the surface of the silicon grain, a gate electrode formed above the channel area via an oxidation film, a drain electrode electrically connecting with the drain area, and a source electrode electrically connecting with the source area.

The above structure allows the transistor component according to the present invention to be fixed on an insulating substrate made of plastic and the like, and use such transistor component with the desired functions. Accordingly, the difficulty of manufacturing large-size silicon substrates can be resolved. Furthermore, as there is no need to implement the step of forming the silicon film in the gaseous conditions of a vacuum apparatus, a substrate with low thermal resistance as described above can be used for the substrate.

In a preferred embodiment of the transistor component according to the present invention, the silicon grain is preferably substantially spherical and made of a silicon monocrystal. The oxidation film is preferably a silicon dioxide film. By using a substantially spherical silicon grain, it is easy to arrange the direction of the silicon grain when placing, arranging or fixing the transistor component according to the present invention on an insulating substrate. Also, by forming the silicon grain from a silicon monocrystal, the performance of the transistor component according to the present invention is enhanced. Forming the oxidation film covering the silicon grain out of silicon dioxide enables this silicon dioxide film to function as a gate electrode. The gate electrode may be formed as a ring surrounding the silicon grain.

The active matrix substrate for a liquid crystal display according to the present invention is structured so a transistor component is provided for each of a plurality of pixel areas defined by data lines and scan lines on an insulating substrate, the transistor component comprising a source area electrically connecting with the data lines, a gate electrode electrically connecting with the scan lines, and a drain electrode electrically connecting with a pixel electrode, wherein the transistor component is a transistor component according to the present invention. By using the transistor component according to the present invention as the switching component of the active matrix substrate for a liquid crystal display, it is possible to manufacture a large-size liquid crystal display.

In a preferred mode of working the active matrix substrate for a liquid crystal display according to the present invention, the transistor component is preferably fixed to the insulating substrate via an adhesive agent, and the adhesive agent is preferably coated on the insulating substrate corresponding to positions where the transistor component is to be arranged. Although the adhesive agent functions to fix the transistor component on the insulating substrate, the transistor component may also be fixed on the insulation film as SOG (spin on glass) and the like. The insulating substrate is preferably a plastic or flexible substrate, and the thermal resistance is preferably 200° C. or less. According to the present invention, there is no need to adopt the CVD or other methods for forming a thin silicon film in a thermal environment of 300° C. to 400° C., so the active matrix substrate for use with a liquid crystal display can be manufactured in a low temperature environment.

A method of manufacturing a transistor component according to the present invention comprises the steps of forming a silicon grain from a silicon piece, forming an oxidation film on the silicon grain surface, forming a gate electrode above the area where the channel area of the silicon grain is to be formed, using the gate electrode as a mask to implant an impurity ion in the silicon grain, thereby forming a drain area and a source area, forming a drain electrode electrically connecting with the drain area, and forming a source electrode electrically connecting with the source area. According to this manufacturing method, the transistor component need only be placed at the desired location, so the step of separating the component required for conventional methods of manufacturing semiconductor components on a silicon substrate can be omitted.

One embodiment of the method for manufacturing the transistor component according to the present invention is preferably implemented under atmospheric pressure without using a vacuum device. The step of forming the silicon grain is preferably a step of forming a substantially spherical silicon grain, the silicon grain is preferably a silicon monocrystal, and the oxidation film is preferably silicon dioxide.

According to another method of manufacturing an active matrix substrate for a liquid crystal display according to the present invention, the substrate is provided with transistor components for each of a plurality of pixel areas defined by data lines and scan lines on an insulating plate, the transistor component comprising a source area electrically connecting with the data line, a gate electrode electrically connecting with the scan line, and a drain electrode electrically connecting with a pixel electrode, and wherein the transistor component is formed by the method of manufacturing the transistor component according to the present invention as described above.

As the preferred mode of the method of manufacturing an active matrix substrate for a liquid crystal display according to the present invention, the transistor component is preferably placed on the insulating substrate by using a dispenser, and the transistor component is preferably fixed on the insulating substrate via an adhesive agent. Especially, the adhesive agent is formed on the insulating substrate by using an inkjet-type recording head.

By employing this structure, there is no need to implement patterning by a photolithography step for the silicon film as conventionally required, thereby simplifying the manufacture steps. In this case, the adhesive agent may be formed on the insulating substrate at positions where the transistor components are to be formed by using an inkjet-type recording head.

Another embodiment of the present invention uses the fine metal wires themselves as the gate lines and/or source lines of the semiconductor component. Used are fine metal wires already in use in the field of IC mounting such as conventional wire bonding. By using the wiring technique of fine metal wires used in the field of IC mounting, it is possible to obtain a semiconductor device relating to the present invention as described herein.

Preferably from the aspect of low resistance, these fine metal wires are made of gold, aluminum, copper or an alloy of the foregoing metals, and have a width of some ten to hundred $\mu$m. A semiconductor device using this wiring is used for an LCD or EL display. In order to prevent short-circuiting when the fine metal wires overlap with each other or with another conductive area, it is preferable to coat the surface of the fine metal wires with an insulation film. By using this insulation film as a layer insulation film or a gate insulation film, it is possible to omit the step of forming this insulation film.

Here, the fine metal wires themselves can be used as the source lines or gate lines of the semiconductor device. If there are any portions of the semiconductor where it is necessary to contact other areas, the insulating coating may be removed at such portions by selective etching. As result, the substrate to which this semiconductor device is applied may be a plastic, flexible or other substrate with a thermal resistance of 200° C. or less.

As described above, prior art exists trying to form the metal wiring out of a liquid containing the wiring material, but by using the fine metal wires as the wiring pattern, it is possible to overcome the difficulties arising in this step.

Furthermore, the fine cutting means described above may be a dicing cutter. This cutter can form very fine cutouts, thereby enabling contact holes to be formed in also very fine silicon bulks.

DESCRIPTION OF THE PREFERRED EMBODIMENTS

Now, the best modes for working the present invention will be described below.

Embodiment 1

(Overall Structure)

Figure 1:
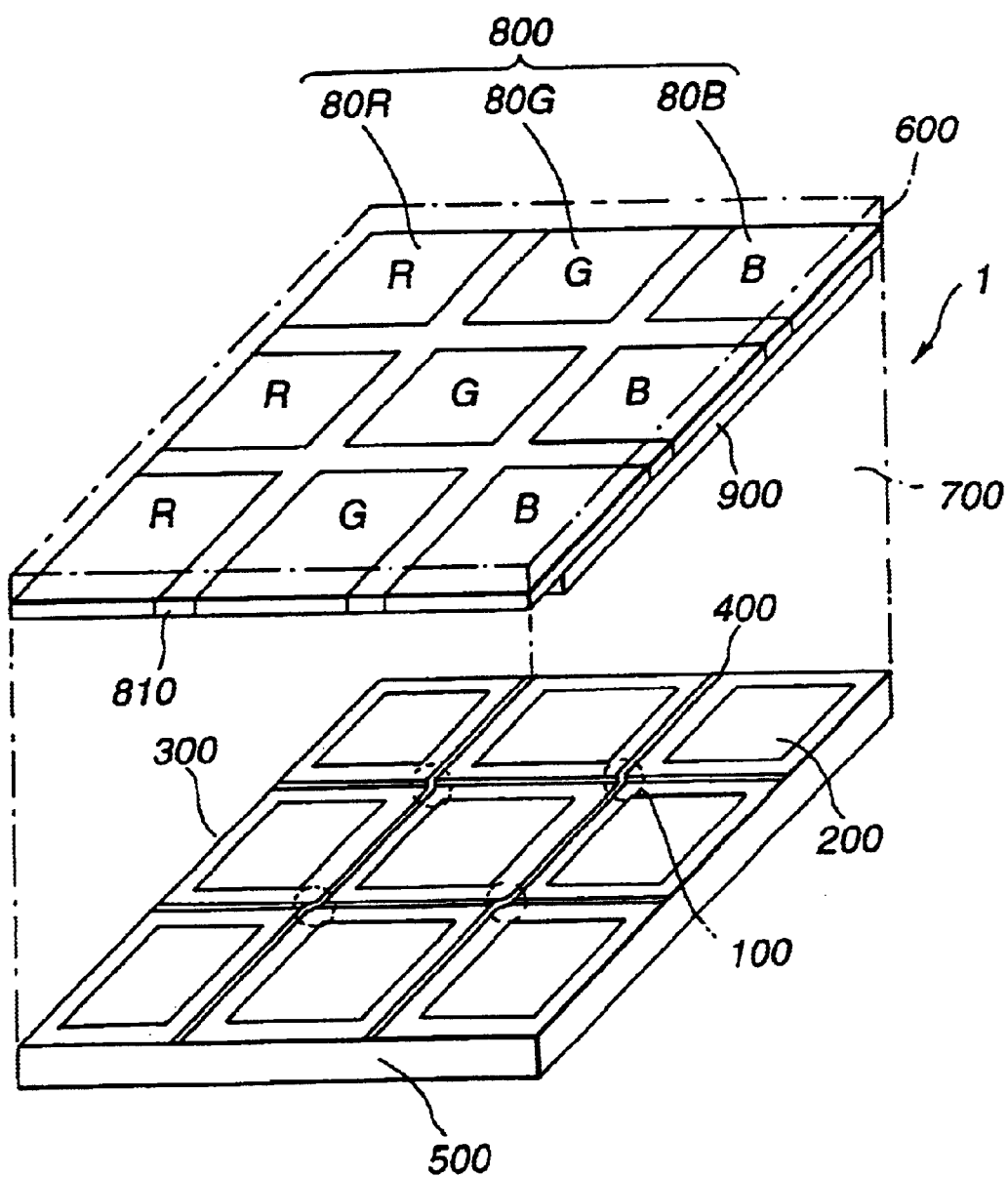
FIG. 1 is an exploded partial perspective view of a color liquid crystal display with an active matrix employing the transistor component according to the present invention.

Embodiment 1 will be described in reference to FIGS. 1–7. FIG. 1 is an exploded perspective view of an active matrix-type color liquid crystal display using the transistor component/semiconductor component according to the present invention. A liquid crystal display 1 includes two transparent substrates 500, 600 enclosing a liquid crystal 700, and a nematic liquid crystal is used as the liquid crystal 700. The operation mode is a TN mode (twisted nematic mode).

A color filter 800 including colored layers 80R, 80G and 80B colored red (R), green (G) and blue (B) is formed on a transparent substrate 600. A black matrix 810 is formed between colored layers 80R, 80G and 80B, and an opposed electrode 900 is formed on the color filter 800 on the side of the transparent substrate 600.

The color filter 800 can be manufactured by using publicly known techniques, for example, by forming a shield film made of metals such as chromium on the transparent substrate 600 and thereafter patterning the substrate in a lattice-pattern by using the photolithography method to form the black matrix 810. Thereafter, colored layers 80R, 80G and 80B are formed by using the dyeing method or paint distribution method, etc.

A pixel electrode 200 is formed on the transparent substrate 500 within the lattice-shaped section area defined by data lines 400 and scan lines 300. Furthermore, transistor components 100 according to the present invention are formed at the intersections between data lines 400 and scan lines 300. Transistor components 100 function as switching components for controlling the signal voltage supplied from pixel electrode 200. Transparent substrates 500, 600 are pasted together so each of colored layers 80R, 80G and 80B is opposed to the pixel electrode 200.

(Structure of Active Matrix Substrate)

Figure 2:
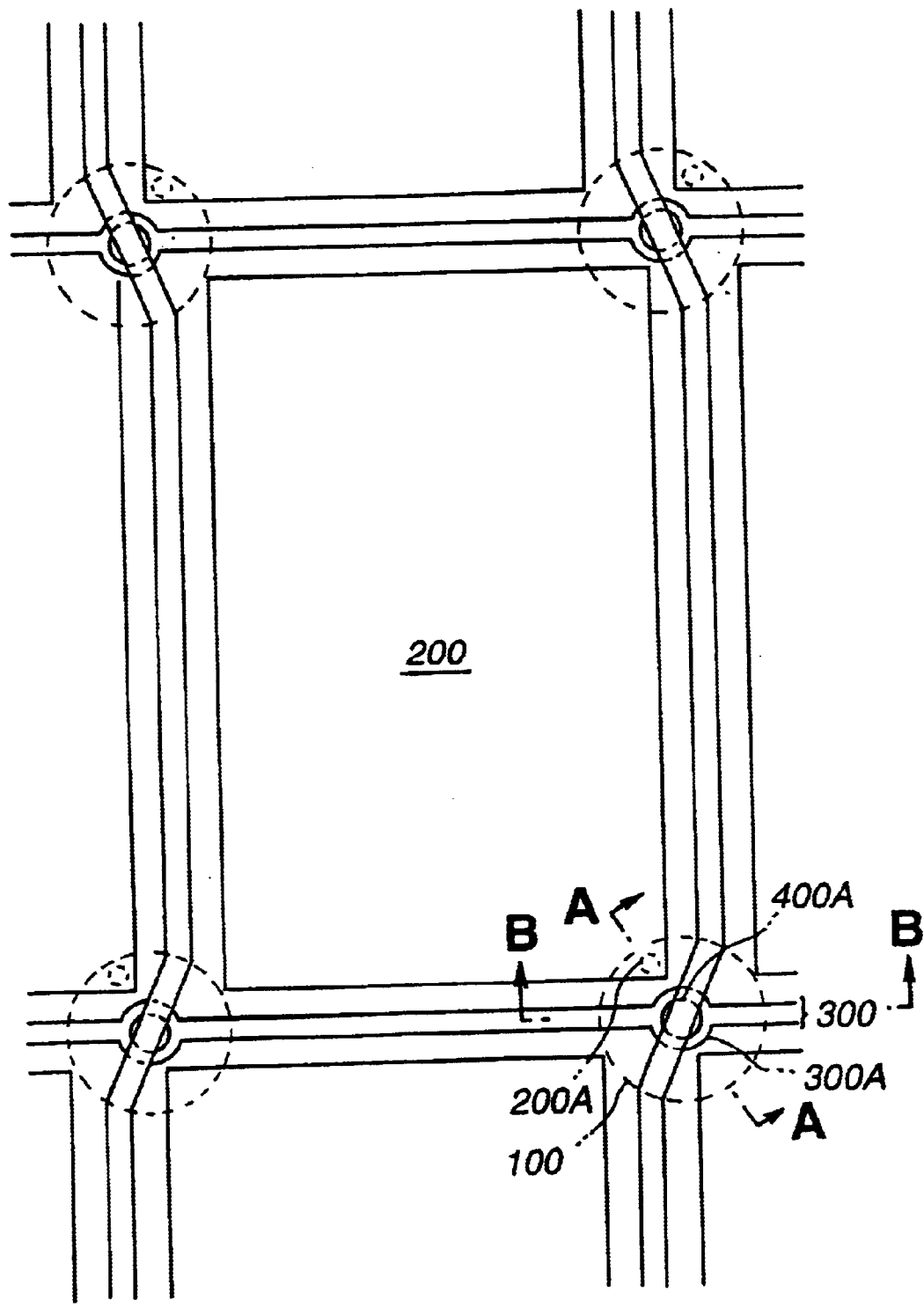
FIG. 2 is a planar view of the active matrix substrate (Embodiment 1) according to the present invention.
Figure 3:
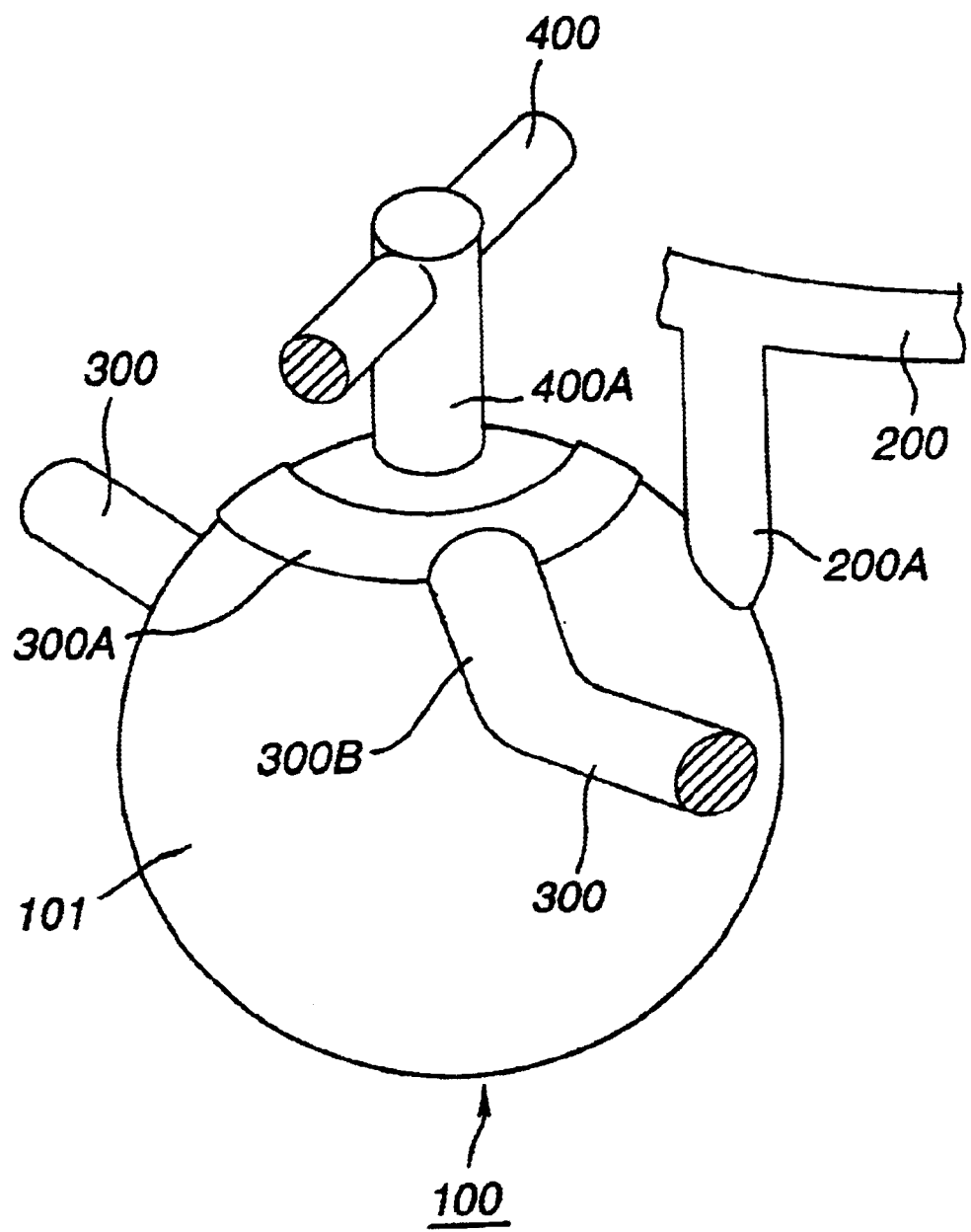
FIG. 3 is a perspective view of the transistor component in FIG. 2 along line X—X.

Next, the structure of the active matrix substrate according to one embodiment of the present invention will be described with reference to FIGS. 2 and 3. FIG. 2 is a planar view of the active matrix substrate. Transistor components 100 are formed at the intersections between data lines 400 and scan lines 300. As described below, transistor components 100 are transistor components made of silicon grains having a substantially spherical shape with a diameter of approximately 100 μm, fixed in arrays on a transparent substrate 500 by an adhesive agent or the like.

On the top of this silicon grain, a gate electrode 300A is formed in pattern in continuation of a scan line 300 and in a substantially ring-shape to surround the upper portion of the silicon grain. Also, a source electrode 400a connecting with the apex of the silicon grain is formed in continuity of a data line 400. The drain electrode 200A electrically connecting with the drain area of the transistor component 100 is formed on the pixel electrode 200.

(Structure of Transistor Component)

Figure 4:
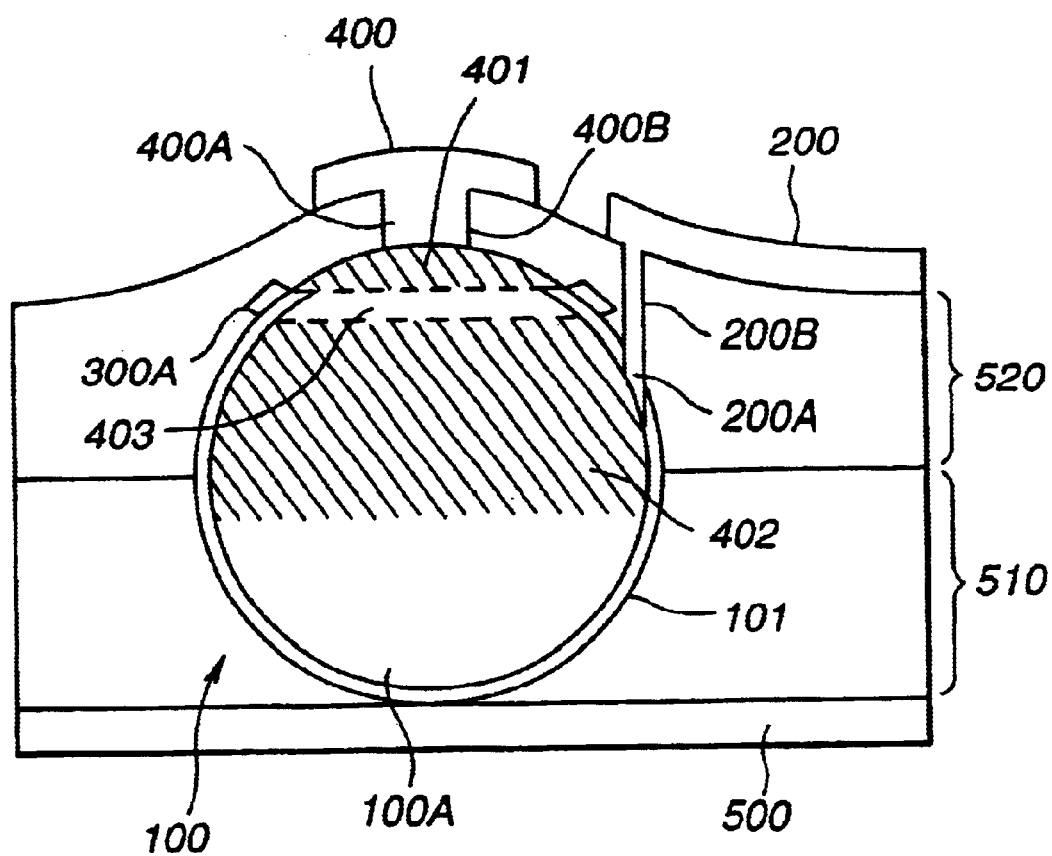
FIG. 4 is a cross-section of the transistor component in FIG. 2 along line A—A.

The overall structure of the transistor component 100 will be described with reference to FIGS. 3, 4. FIG. 3 three-dimensionally illustrates the connection state between the gate electrode 300A, the drain electrode 200A and the source electrode 400A. The insulation layer, etc., between these electrodes have been omitted in the drawings.

As described above, the transistor component 100 is made of a silicon grain, and the surface thereof is a silicon oxidation film 101. The silicon grain is preferably shaped as a sphere. The silicon oxidation film 101 beneath the gate electrode 300A functions as a gate oxidation film.

Accordingly, the thickness of the oxidation film 101 is preferably within the range of 10 Å to 10 μm, and the width of the gate electrode 300A is preferably within the range of 0.1 μm to 100 μm. As described below, an impurity has been introduced in the transistor component 100 with the gate electrode 300A as the mask. Therefore, as shown in FIGS. 3 and 4, with the gate electrode 300A as the boundary, the lower portion of the silicon grain (at the side of transparent substrate 500) functions as the drain area and the upper portion of the silicon grain (at the side of transparent substrate 600) functions as the source area.

The gate electrode 300A is formed substantially in the shape of a ring to surround the apex of the transistor component 100, and a connection 300B is formed between the gate electrode 300A and the scan line 300. As described below, the scan line 300 is formed on the insulation film (film thickness approximately half the diameter of transistor component 100) formed on the transparent substrate 500.

Also, as the gate electrode 300A is formed at a position higher than this insulation film, a connection 300B is formed along the surface of the transistor component 100 to connect the foregoing two.

The scan line 300 and the gate electrode 300A and the connection 300B can be obtained by forming the same material (e.g. aluminum or polycrystalline silicon) as a film on the desired area and patterning such film.

The cross-section of the transistor component 100 will be described by reference to FIG. 4. This figure corresponds to the cross-section of the component in FIG. 2 along line A—A. An insulation film 510 is formed on the transparent substrate 500 to fix the transistor component 100, and the transistor component 100 is fixed on the transparent substrate 500 at each of the locations where the scan line 300 and the data line 400 cross each other in array.

Furthermore, the drain electrode 200A connecting with the pixel electrode (ITO electrode) via the contact hole 200B formed on the insulation film 520 connects with the drain area 402 on the transistor component 100, and the source electrode 400A connecting with the data line 400 via the contact hole 400B connects with the source area 401 on the transistor component 100.

The area below the gate electrode 300A functions as a channel area 403. The transistor component 100 has formed on its surface a silicon oxidation film 101, and the silicon oxidation film 101 above the gate electrode 300A is removed by etching, and the surface of the silicon grain is exposed. This is because the source electrode 400A is to be electrically connected with the source area 401 via the contact hole 400B of the insulation film 520.

(Manufacturing Process of Transistor Component)

Figure 5:
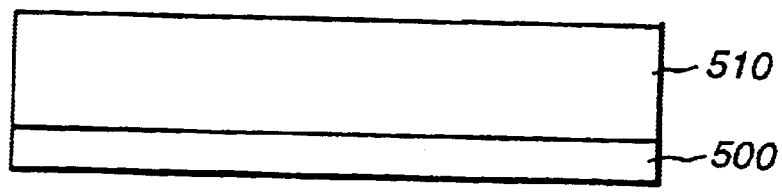
FIGS. 5A–5C illustrate the manufacture process of the substrate in FIG. 2 along line B—B.
Figure 5:
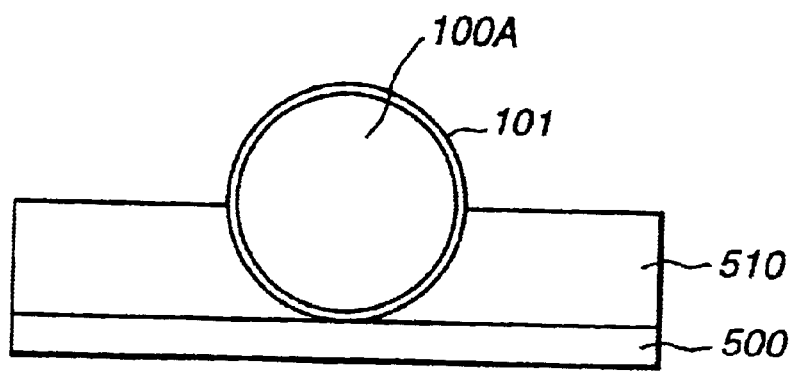
Figure 5:
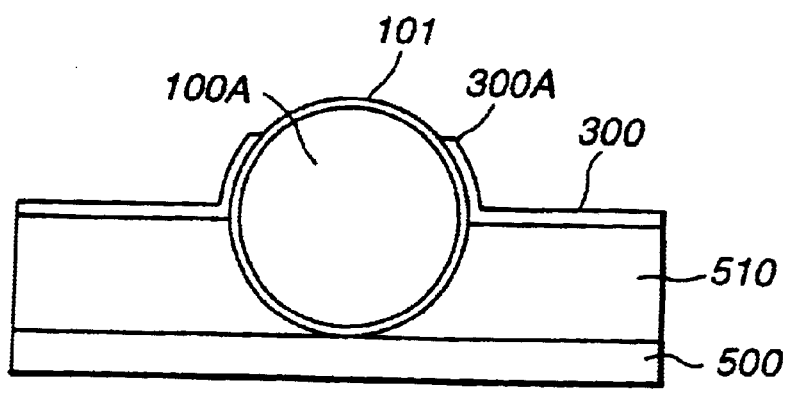
Figure 6:
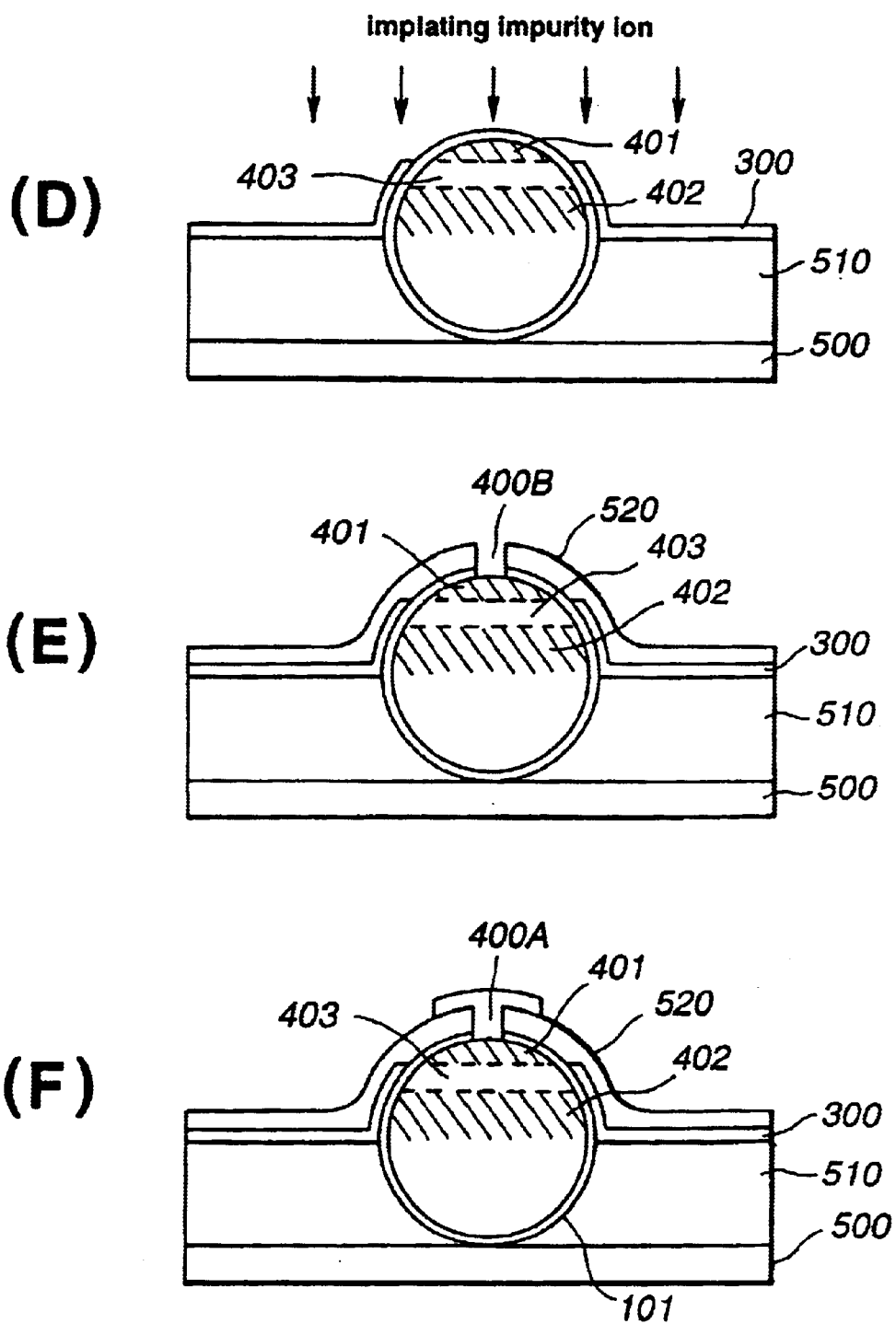
FIGS. 6D–6F illustrate the manufacture process of the substrate in FIG. 2 along line B—B.
Figure 7:
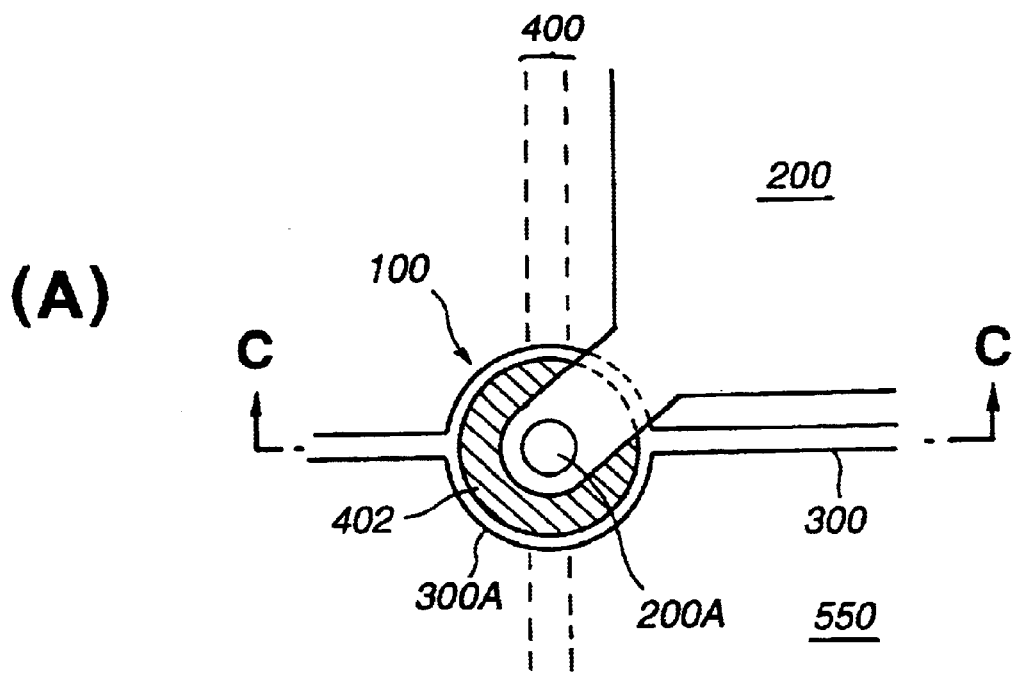
FIG. 7(A) is a partial planar view of the active matrix substrate relating to the present invention.
FIG. 7(B) is a cross-section of the same along line C—C.
Figure 7:
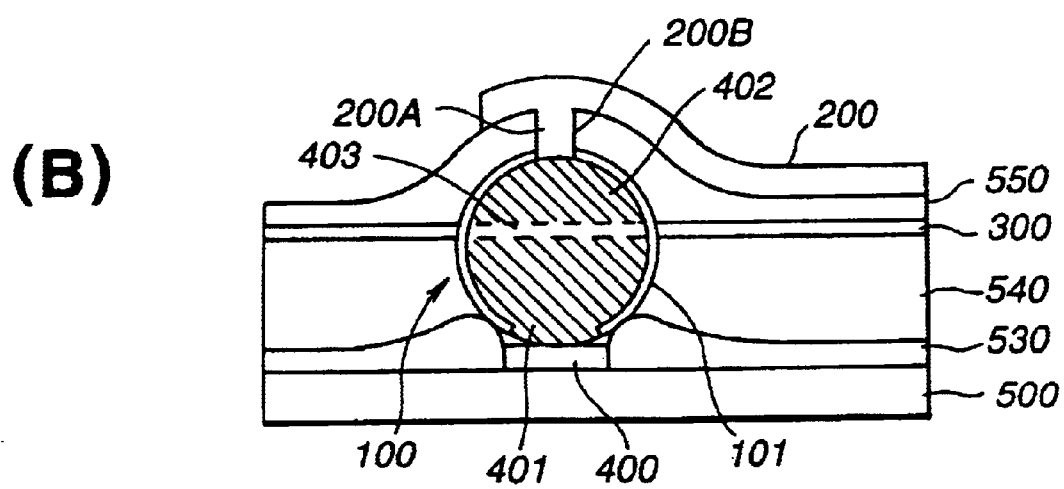

Now, the process of manufacturing the transistor component 100 will be explained in reference to FIGS. 5 and 6. This process is explained by using the cross-section along line B—B of the component in FIG. 2.

Step of forming an insulation film for fixing the transistor component (FIG. 5(A))

The transparent substrate 500 may be a plastic or flexible substrate or the like. Also, widely used non-alkali glass may be used. According to the present invention, it is not necessary to form a thin silicon film on the substrate by using the CVD or other methods, so an active matrix substrate for liquid crystal display can be manufactured by a low temperature process. Accordingly, the transparent substrate 500 may be an insulating substrate with a thermal resistance of 200° C. or less.

After washing the transparent substrate 500, an insulation film 510 is formed for fixing the transistor component 100 on the transparent substrate 500. This insulation film 510 may be an adhesive agent with ultraviolet ray-setting or thermosetting property. This adhesive agent may be coated on the whole surface of the transparent substrate 500 as the insulation film, or only at the location for fixing the transistor component 100.

In this case, the adhesive agent may be coated using an inkjet-type recording head. The insulation film 510 may be formed as SOG (spin on glass) by spin coating a solution of glass in an organic solvent on the transparent substrate 500 and applying heat treatment thereto. The heat treatment is applied after implanting the transistor component 100 on the transparent substrate 500.

Step of mounting silicon grain (FIG. 5(B))

Figure 10:
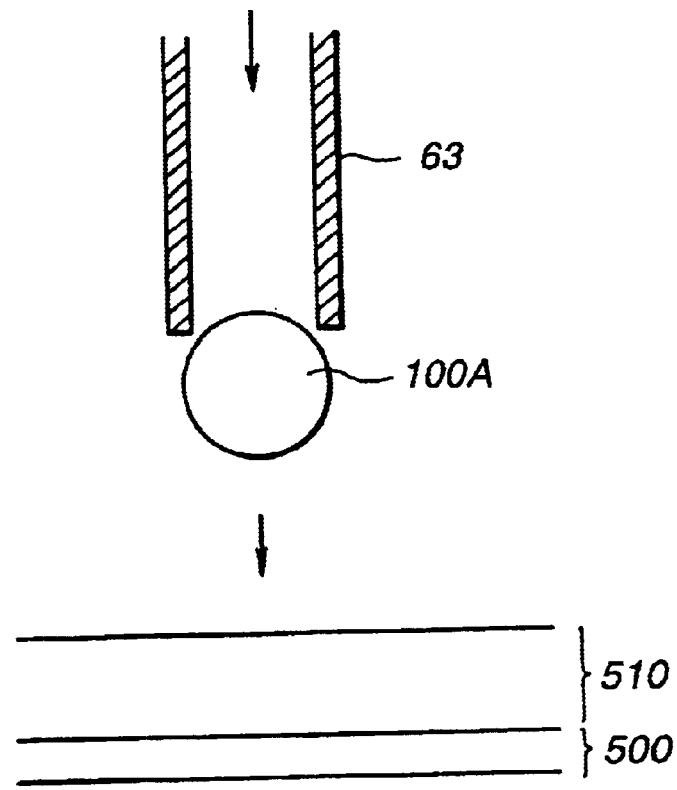
FIGS. 10A–10B illustrate the step of implanting the silicon grain.
Figure 10:
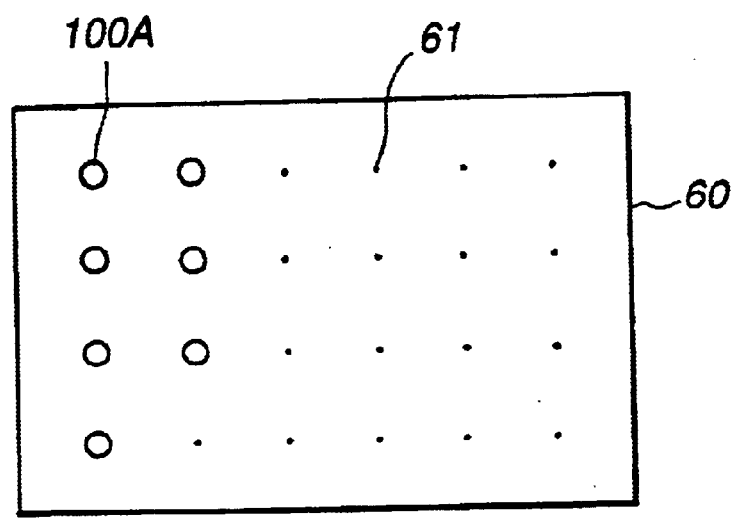

In this step, the silicon grain 100A with its surface covered with the oxidation film 101 is mounted on the transparent substrate 500, and then fixed on the transparent substrate 500 by the adhering effect of an adhesive agent or the like. As shown in FIG. 10(A), when mounting the silicon grain 100A on the transparent substrate 500, the interior pressure of the nozzle 63 is decreased to suction the silicon grain 100A at its tip, the nozzle 63 is transferred to a predetermined position, then this decrease in pressure is released and a plurality of silicon grains are arranged in array on the substrate.

As shown in FIG. 10(B), it is possible to mount a plurality of silicon grains 100A in array on the substrate at one time by suctioning the silicon grains to each of a plurality of air suction bores 61 formed on a mounting plate 60 having a plurality of air suction bores 61 provided thereon corresponding to the positions of the transistor component 100 to be formed on the active matrix substrate, and thereafter introducing compressed air.

The silicon grain 100A is obtained by crushing a silicon piece into fine particles, which are then polished in a mixer containing abradant material. Alternatively, the silicon piece is dissolved, sprayed and then cooled to obtain the silicon grain 100A. The silicon grain size is preferably approximately 100 $\mu$m in diameter, without limitation. In order to form the oxidation film 101 on the surface of the silicon grain 100A, the silicon grain 100A is put into an oxidation furnace to make the silicon oxidation film 101 grow. The thickness of the oxidation film 101 is preferably within the range of 10 Å to 10 $\mu$m.

Step of forming gate electrode (FIG. 6(D))

A thin film of aluminum or the like as the gate electrode 300A is formed on the insulation film 510 and the exposed surface of the silicon grain 100A by sputtering. The film thickness is approximately 0.8 $\mu$m. The gate electrode 300A, the connecting portion 300B, and the scan line 300 are all formed in one step by forming the aluminum film and patterning the same in the shape shown in FIG. 3.

During this step, the gate electrode 300A and the pattern of the scan line 300 may be formed by delivering a solution of fine gold particles of approximately 100 Å in size in a solvent by an inkjet-type recording head.

Step of implanting impurity ion (FIG. 6(D))

The gate electrode 300A is used as a mask to implant an impurity ion in the silicon grain 100A, thereby forming the source area 401 and the drain area 402 in the silicon grain 100A. As no impurity ion is implanted in the silicon grain 100A below the gate electrode 300A, such area functions as a channel layer 403.

In this step, the gate electrode 300A is used as a mask for implanting impurity ions, so the channel layer 403 is a self-aligning structure formed only below the gate electrode 300A. However, an LDD (lightly doped drain-source) structure may be adopted, too. For introducing the impurity ion, the ion doping method can be used, according to which a non-mass-separating ion implantor is used for simultaneously implanting the dopant impurity material and hydrogen. It is also possible to use the ion implantation method according to which a mass-separating ion implantor is used to implant only the desired impurity ion. After implanting the impurity ion, the silicon grain 100A is irradiated with laser to be annealed, and to recover the crystalline property of the silicon grain 100A.

Step of forming insulation film (FIG. 6(E))

After forming the source area 401, the drain area 402 and the channel area 403 of the transistor component 100, the insulation film 520 is formed in a manner to cover the transistor component 100 and the scan line 300. During this step, the insulation film 520 is formed by forming a silicon oxidation film using the CVD or PVD method. Thereafter, the contact hole 400B is formed at a position corresponding to the source area 401 of this insulation film 520. Although not illustrated, the contact hole 200B is formed at a position corresponding to the drain area 402 of the insulation film 520. Naturally, it is also possible to form various electrode patterns or insulation film patterns by coating a liquid substance on the semiconductor component via an inkjet-type recording head, instead of using a film manufacturing method using gaseous phases (such as CVD or PVD). This applies to all embodiments described herein. Using a silicon bulk renders an improved semiconductor component manufacturing method in that a method of utilizing gaseous phases is not used for the silicon substrate. Also, as described below, the metal pattern may be formed of the fine metal wires themselves.

Step of forming source electrode (FIG. 6(F))

After forming the aluminum film on the surface of the insulation film 520 by sputtering, this aluminum film is patterned, and the source electrode 400A and the data line 400 are formed in one step. As shown in FIG. 4, the pixel electrode 200 and the drain electrode 200A connecting with this pixel electrode 200 are formed. In this case, the pixel electrode 200 is obtained by forming a thin film of ITO (indium thin oxide) on the insulation film 520 and thereafter forming a resist mask (not illustrated) at a desired area, then wet etching them all using aqua regia substances or HBr, etc., or dry etching them all using gases such as $CH_4$, and performing the patterning.

Furthermore, other than an ITO film, the pixel electrode 200 may be composed of materials having both light transmitting and conductive property, such as the combined oxide of indium oxide and zinc oxide. The active matrix substrate may be manufactured by the above methods.

Embodiment 2

A second embodiment of the present invention will be described in reference to FIGS. 7–11. This embodiment relates to an active matrix type color liquid crystal display to which the transistor component relating to the present invention is employed, and differs from embodiment 1 in that the source area 401 of the transistor component 100 is positioned at the lower side (side of transparent substrate 500), and the drain area 402 is positioned at the upper side (side of transparent substrate 600).

(Structure of transistor component)

FIG. 7(A) illustrates the positional relationship on a plane of the transistor component including a portion of the pixel electrode formed on the active matrix substrate and each of the wirings (data lines, scan lines, etc.). Furthermore, FIG. 7(B) is a cross-section of the substrate in FIG. 7(A) along line C—C. As described above, the drain area 402 is formed on the upper hemisphere of the transistor component 100, and the source area 401 is formed on the lower hemisphere. The channel area 403 is formed on the area surrounded by the gate electrode 300A.

The data line 400 is formed on the transparent substrate 500, and the insulation film 530 made of PSG (phosphosilicate glass) is formed on the side face of the data line 400 and the whole face of the transparent substrate 500.

The transistor component 100 is fixed above the data line 400, and the source area 401 connects with the data line 400. In this case, the transistor component 100 is fixed via insulation film 540 made of an adhesive agent or the like formed on insulation film 530. This adhesive agent may be coated on the whole surface of insulation film 530 or only at the locations where the transistor component 100 should be fixed.

The scan line 300 and the gate electrode 300A are formed integrally on this insulating film 540 in one step. The gate electrode 300A is formed substantially in the shape of a ring surrounding the transistor component 100. The silicon oxide film 101 is formed on the surface of the transistor component 100, and the silicon oxide film 101 below the gate electrode 300A functions as the gate oxidation film.

As insulation film 550 made of silicon oxide or the like is formed on the insulation film 540. A drain electrode 200A formed integrally with the pixel electrode 200 via the contact hole 200B formed on the insulating film 550 connects with the drain area 402 on the transistor component 100.

(Step of manufacturing transistor component)

Figure 8:
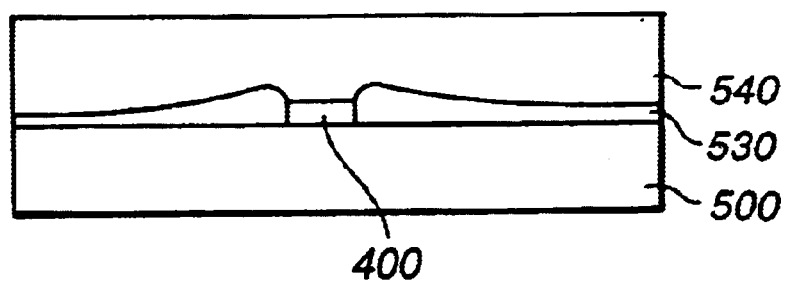
FIGS. 8A–8C illustrate the manufacture process of the substrate in FIG. 7(A) along line C—C.
Figure 8:
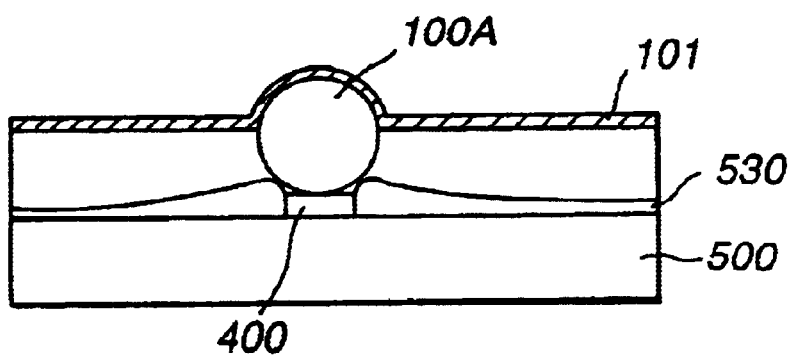
Figure 8:
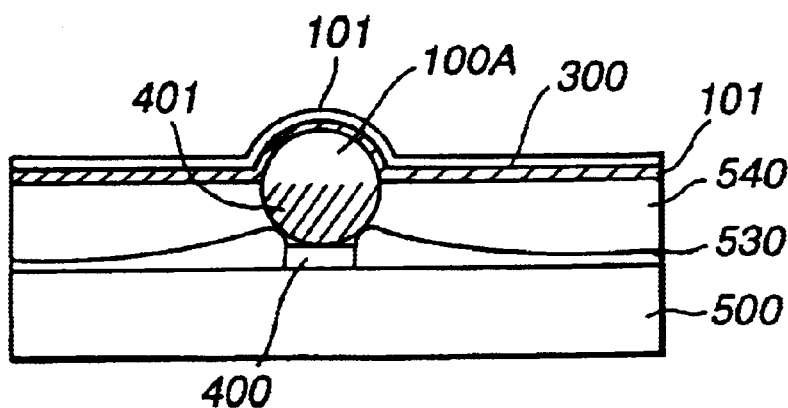
Figure 9:
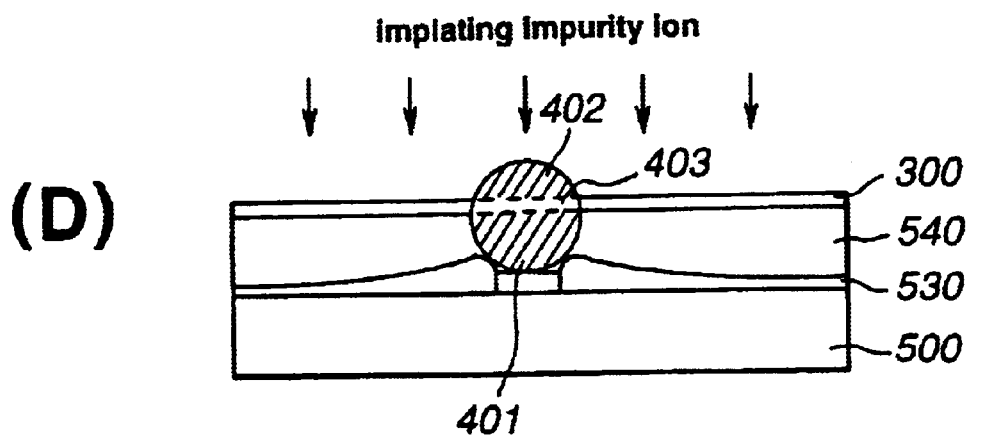
FIGS. 9D–9F illustrate the manufacture process of the substrate in FIG. 7(A) along line C—C.
Figure 9:
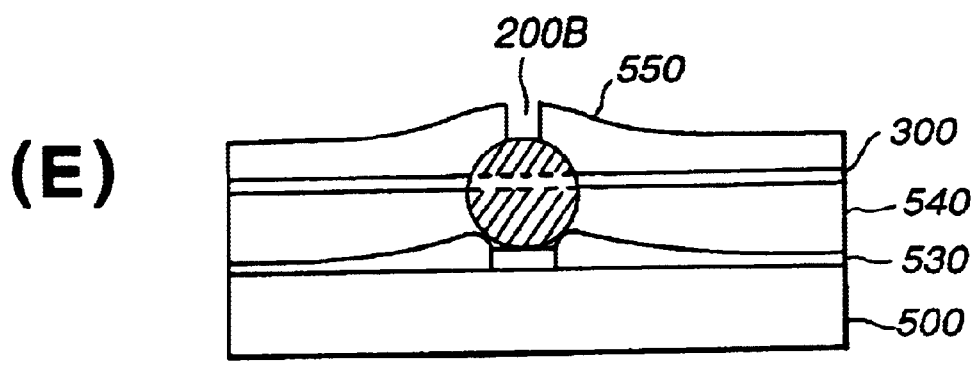
Figure 9:
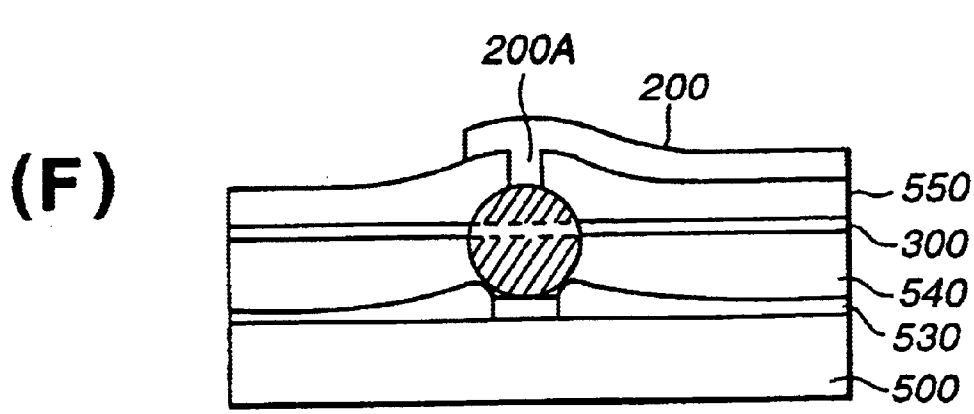
Figure 11:
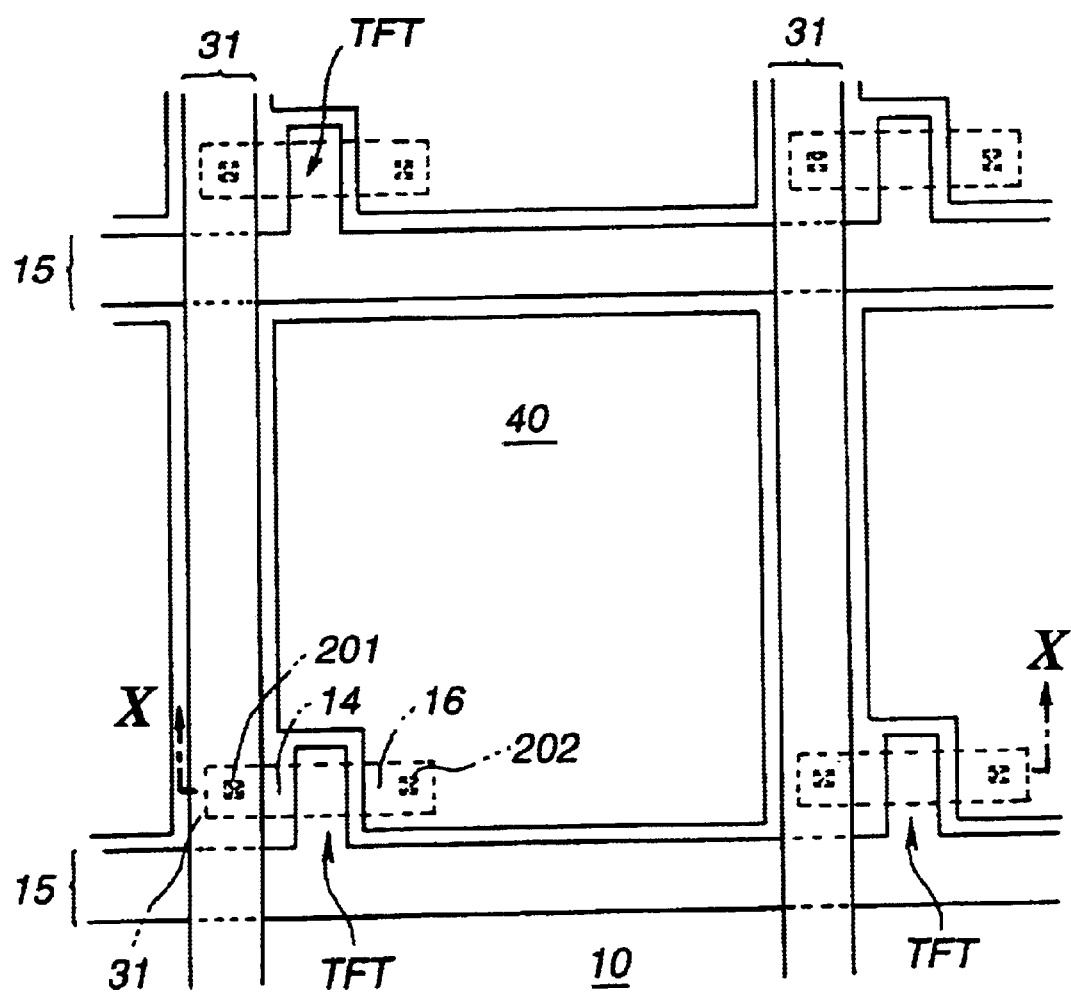
FIG. 11 is a planar view of a conventional active matrix substrate.
Figure 12:
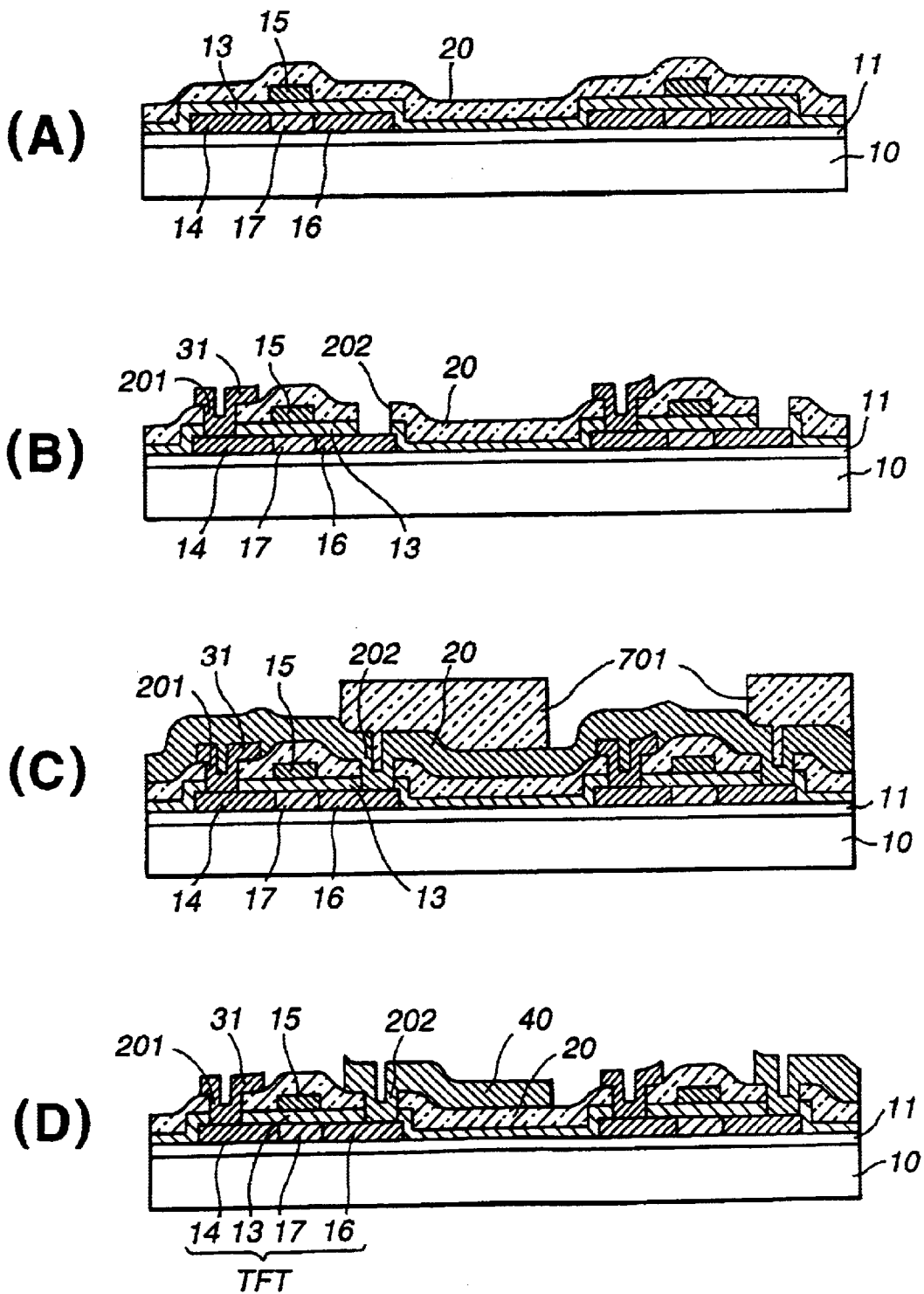
FIGS. 12A–12D illustrate the manufacture process of the substrate in FIG. 11 along line X—X.

Now, the step of manufacturing the transistor component 100 will be explained with reference to FIGS. 8 and 11. The steps shown in these figures correspond to the cross-sections of the transistor component in FIG. 7(A) along line C—C.

Step of forming data lines (FIG. 8(A))

A widely used non-alkali glass is used as the transparent substrate. After washing the transparent substrate 500, an aluminum film which will become the data line is formed on the transparent substrate 500 by sputtering. Next, the resist film (not illustrated) is formed in the desired area and then the aluminum film is patterned to form the data line 400.

Thereafter, a PSG film is formed to cover the side face of the data line 400 and the whole surface of the transparent substrate 500, patterning is performed to expose the surface of the data line 400, and insulation film 530 is formed. After forming insulation film 530, insulation film 540 made of an adhesive agent or the like is formed to fix the transistor component 100 on the substrate.

Furthermore, during the step of forming the data line 400, the pattern may be formed by delivering a solution of fine gold particles of approximately 100 Å in size in a solvent by an inkjet-type recording head.

Step of mounting silicon grain (FIG. 8(B))

The silicon grain 100A with its surface covered with the oxidation film 101 is mounted on the data line 400, and then fixed onto the data line 400 by the adhering effect of an adhesive agent, etc. An impurity ion is mounted in advance on this silicon grain 100A in the area to become the source area 401.

Step of forming gate electrode (FIG. 8(C))

An aluminum film which will become the gate electrode is formed on the insulation film 540 and patterned in the desired shape, thereby integrally molding the gate electrode 300A and the scan line 300 in one step.

As described above, during the step of forming the gate electrode 300A, the patterning may be performed by delivering a solution of gold from an inkjet-type recording head.

Step of implanting impurity ion (FIG. 9(D))

The gate electrode 300A is used as a mask for implanting impurity ions into the silicon grain 100A, thereby forming the drain area 402 on the silicon grain 100A. During this step, the gate electrode 300A is used as the mask for implanting the impurity ion, so the channel layer 403 is a self-aligning structure formed only below the gate electrode 300A. However, an LDD (lightly doped drain-source) structure may be adopted, too. For introducing the impurity ion, the ion doping method may be used, according to which a non-mass-separating ion implantor is used for simultaneously implanting the dopant impurity material and hydrogen. It is also possible to use the ion implantation method according to which a mass-separating ion implantor is used to implant only the desired impurity ion.

After implanting the impurity ion, silicon grain 100A is irradiated with laser to be annealed, and the crystalline property of the silicon grain 100A is recovered.

Step of forming insulation film (FIG. 9(E))

After forming the drain area 402 and the channel area 403 of the transistor component 100, the insulation film 550 is formed in a manner to cover the transistor component 100 and the scan line 300. During this step, the insulation film 550 is formed by forming a silicon oxidation film according to the CVD or PVD method. Thereafter, the contact hole 200B is formed at a position corresponding to the drain area 402 of this insulation film 550.

Step of forming drain electrode (FIG. 9(F))

After forming a thin film of ITO on the insulation film 550 and thereafter forming a resist mask (not illustrated) at a desired area, then wet etching them all using aqua regia substances or HBr, etc., or dry etching them all using gases such as $CH_4$, and performing the patterning, the pixel electrode 200 and drain electrode 200A are formed.

The active matrix substrate may be manufactured by the above method. When driving the transistor component 100 based on control signals supplied via the scan lines 300, the liquid crystal cell formed between the pixel electrode 200 and the opposing electrode 900 are written with picture data from the data line 400 via the transistor 100, thereby providing the desired picture display.

Embodiment 3

Figure 13:
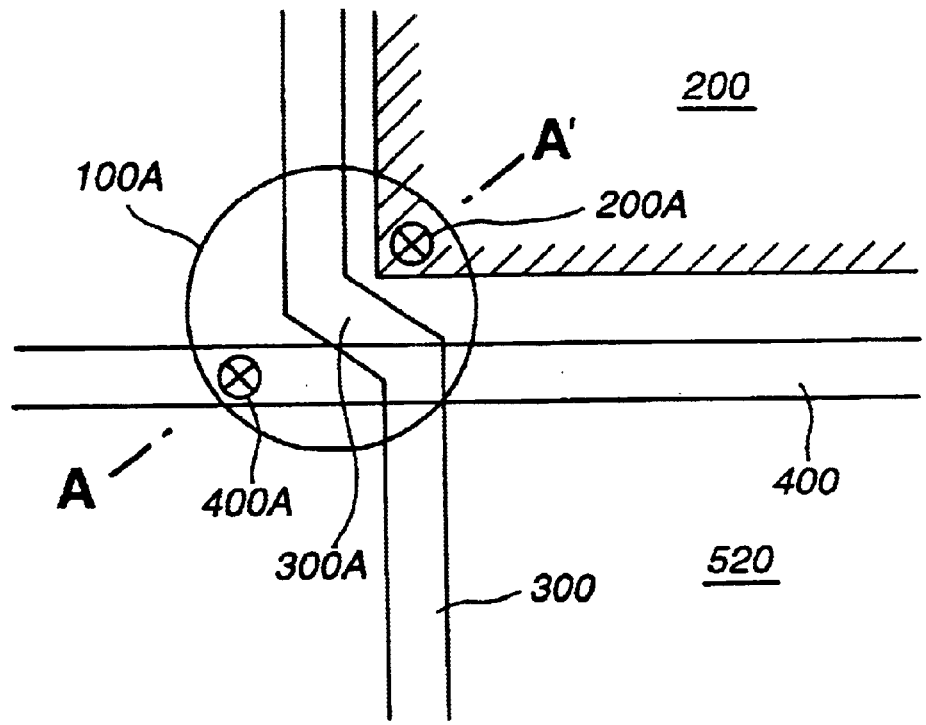
FIG. 13 is a planar view of the third embodiment of the present invention.
Figure 14:
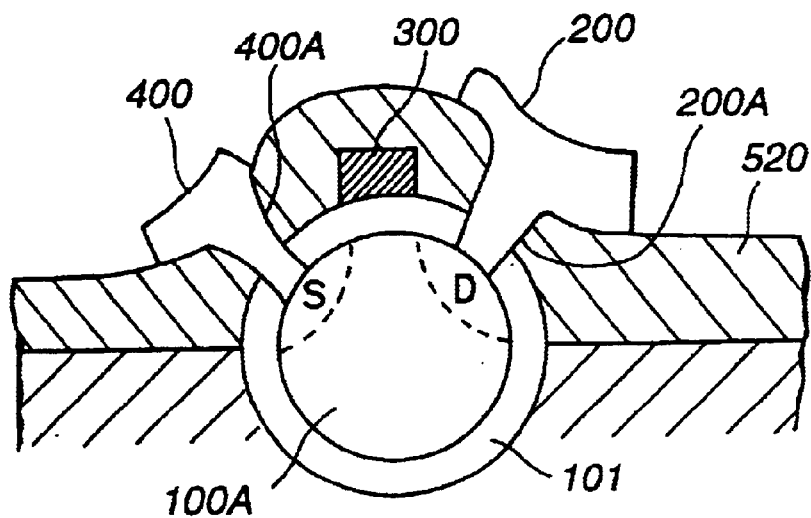
FIG. 14 is a cross-section of the embodiment in FIG. 13 along line A-A'.

Next, a third embodiment of the present invention will be explained. A planar view of this third embodiment is indicated in FIG. 13, and FIG. 14 is a cross section of the same along line A-A'. This embodiment differs from the first and second embodiments in how to set the positional relationship between the channel, source and drain areas when fixing the silicon ball described above on the insulating substrate. In short, the locations of forming these areas in the silicon grain are not specifically limited as long as the silicon grain is effective as a semiconductor component.

As in the first and second embodiments, the cross-sectional view in FIG. 14 indicates that the source electrode 400A and the drain electrode 200A are placed opposite to each other at the upper side of FIG. 14 on the insulation film 520 via the gate electrode 300A of the silicon grain 100A placed on the insulation film. Thereby, the source electrode 400A and the drain electrode 200A contact the silicon ball.

When forming this semiconductor component, a scan line 300 is formed in a belt-shaped pattern on the insulation film 520 as shown in FIG. 13. Then, the scan line 300 is formed in a crooked manner across the silicon grain 101A.

The gate line 300 and the data line 400 are electrically insulated from each other via the layer insulation film 520 and patterned to cross each other at substantially right angles. As shown in FIG. 14, the source electrodes 400A linked with this source line 400 is connected with the silicon grain 100A via the contact hole. Furthermore, the drain electrode 200A linked with the pixel electrode 200 is linked with the drain area of the silicon grain via the contact hole.

Regarding the method of manufacturing these electrodes, the method of forming a source area on the silicon grain in continuity with the source electrode, and the method of forming a drain area in the silicon grain, etc., are the same as in the embodiments described above. According to the present embodiment, the gate line, source line, pixel electrode, etc. are formed on the same side of the silicon grain, so the step itself is relatively simple compared to embodiments 1 and 2.

Now, methods of forming the contact hole in the oxidation film 101 surrounding the silicon grain 100A will be explained below:

First example: A resist pattern is formed on the silicon oxidation film and is etched. The resist pattern is coated via an inkjet printer.

Second example: The silicon oxidation film is irradiated with laser to form a hole for contact use.

Figure 15:
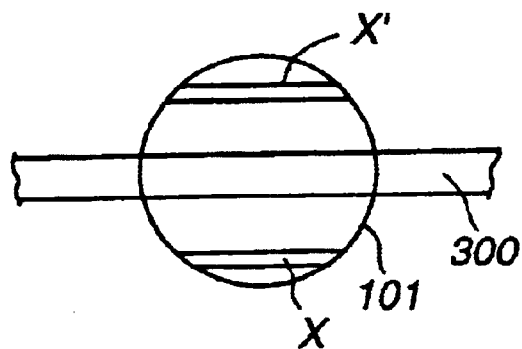
FIG. 15 is a planar view of a model of the silicon grain with a notch formed therein to form the contact hole in the oxidation film.

Third example: A dicing cutter is used to form a cutout corresponding to the contact hole. FIG. 15 is a planar view of a silicon grain model with a cutout formed therein as seen from above. Reference X is the cutout formed in the oxidation film 101 formed around the silicon grain, and is the contact hole linked with the source area or the drain area of the silicon grain.

X' is a similar cutout opposed to X across the gate electrode 300, and is the cutout linked with the drain area or the source area opposed to X across the gate electrode. When forming a contact hole in the semiconductor component including a silicon grain, a dicing cutter or another fine cutting tool is used to enable a contact hole to be formed without using any chemical means such as etching, etc. These fine cutting tools enable fine silicon grains with a cutout (cut) of approximately a few to ten micrometers in width.

Figure 16:
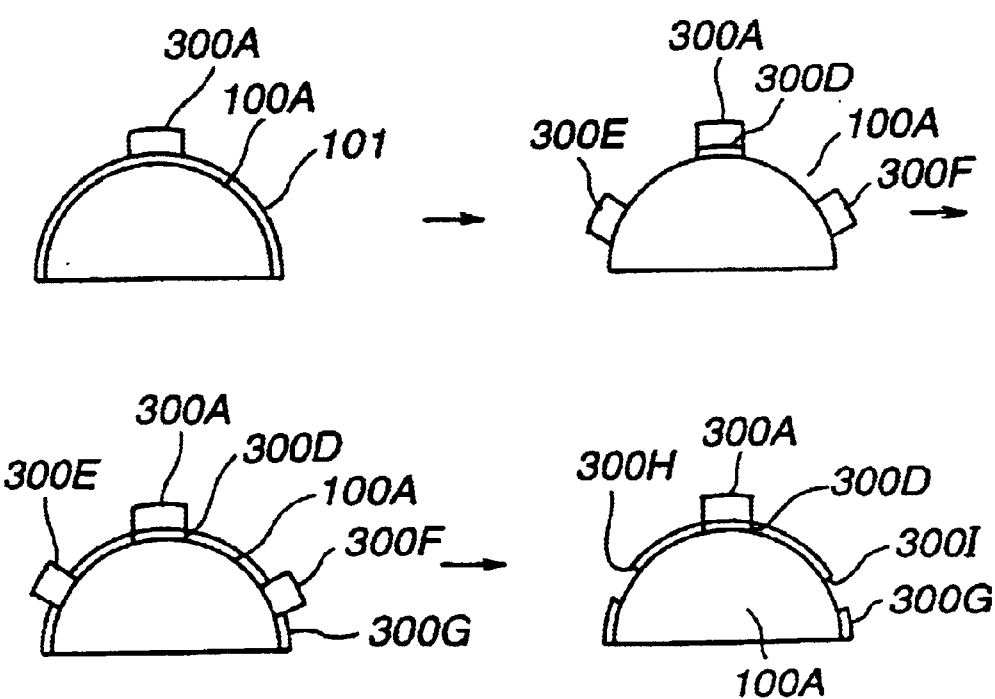
FIG. 16 is a model view of another embodiment for forming this contact hole.

Fourth example: As shown in FIG. 16, a gate electrode 300A is formed on the insulation film 101 around the silicon grain 100A. Next, the gate electrode 300A is used as the mask for etching the insulation film 101. The silicon oxidation film 101 below the gate electrode is not etched, and remains as the gate insulation film 300D.

Thereafter, resist patterns 300E and 300F are formed on the drain area and the source area of the silicon grain. Then, a silicon dioxide 300G is formed by the LPD or other methods described above. At this time, silicon dioxide is not formed on the portions where a resist pattern is formed. Then, by removing the resist, contact holes 300H, 300I connecting with the source area or drain area are formed.

Fifth example: Etching fluid is directly dropped on the silicon oxidation film 101 in fine patterns via an inkjet-type printer to directly form the contact hole.

Embodiment 4

Figure 17:
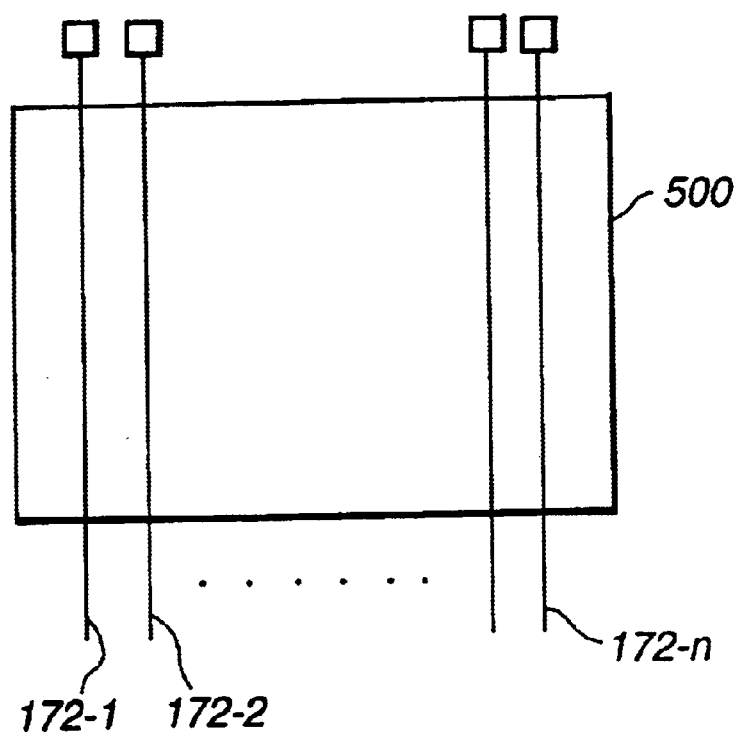
FIGS. 17A–17B are model views of forming a conductive wiring pattern of the semiconductor component by using the fine metal wiring themselves.
Figure 17:
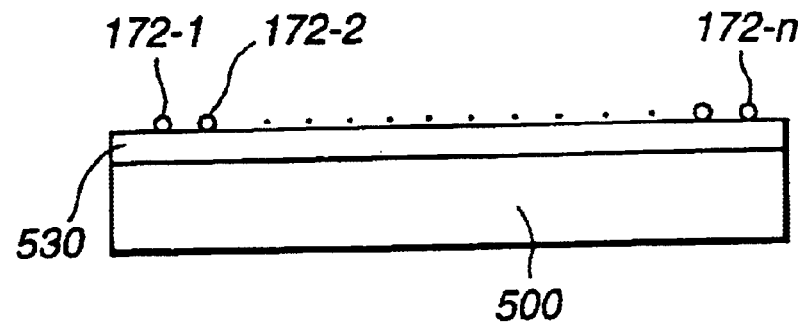

Now, a fourth embodiment will be explained below. The characteristic of this embodiment is that the conductive wiring pattern of the semiconductor component is formed by the fine metal wires themselves. FIG. 17 is a model view explaining this embodiment in a simple manner. FIG. 17(A) is a planar view, (B) is a cross section. Fine metal wires 172-1 . . . 172-n are arranged at equal intervals and in a parallel way on the adhesive agent layer 502 on the substrate 500. Concerning the fine metal wires, the IC mounting technique can be applied thereto such as wire bonding, etc., which are already publicly known at the filing date of the present application. In this publicly known technical field, the material forming the metal wire, the wire diameter, the method of feeding metal wire from a plotter and transferring it by predetermined pitches, and the method of connecting the fine metal wires respectively to a plurality of pads of the semiconductor component are all well known. Also well known is using ultrasonic waves for such method of connection. The fine metal wires themselves need only be approximately 10 µm in diameter to enable use as a wiring pattern in any of the embodiments above.

According to the present embodiment, the difficulties when forming the metal wiring can be overcome during the forming of wiring patterns using gaseous phases or inkjet printer as described above. As it is possible to fix the fine metal wires on the semiconductor component at low temperature, the semiconductor component can be formed on a plastic substrate. Furthermore, it is possible to use a large-size substrate (approximately 1×1 $m^2$). A vacuum component is not required, and the photolithography step can be omitted.

Figure 18:
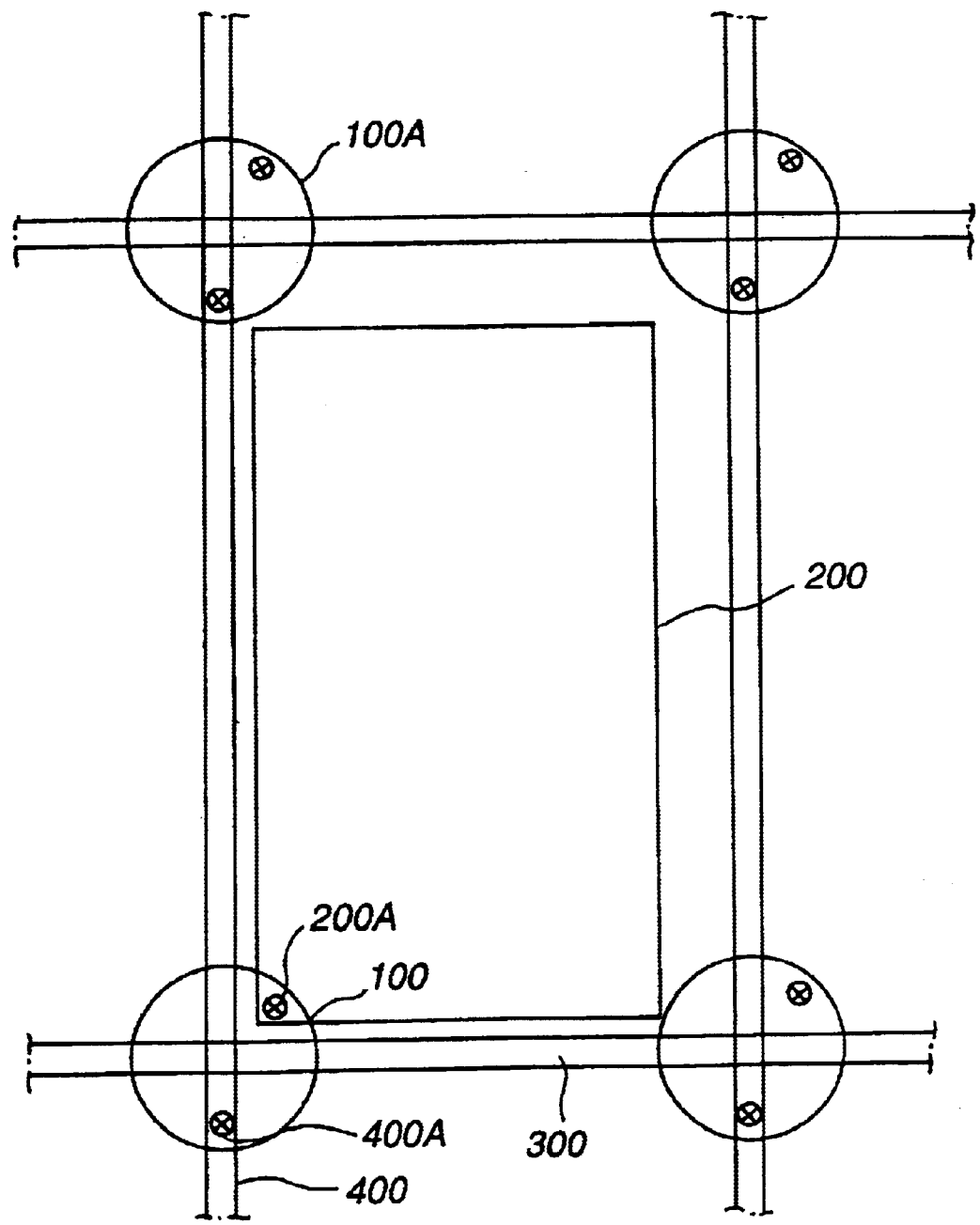
FIG. 18 is a planar view of the pattern in FIG. 17.
Figure 19:
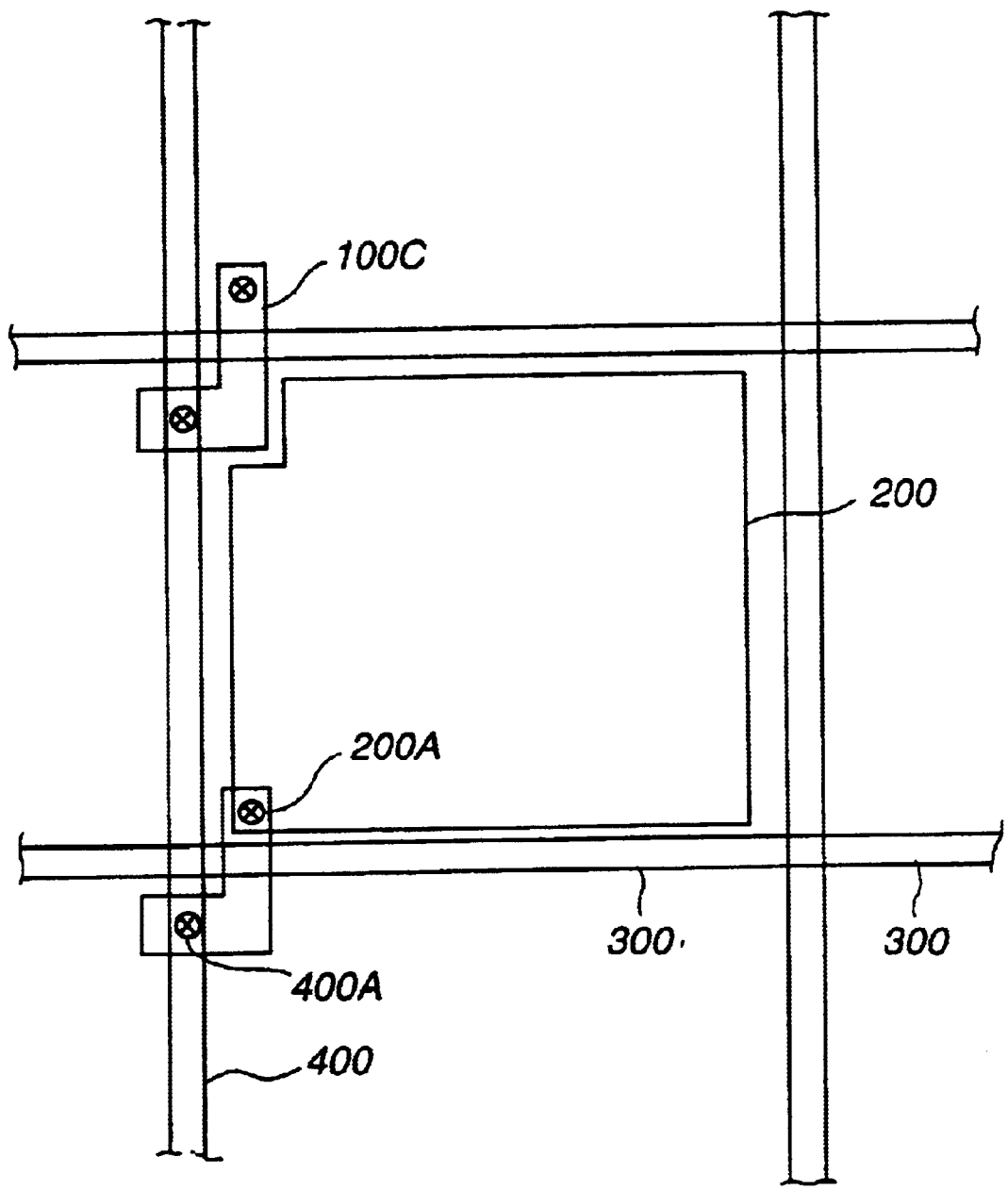
FIG. 19 is a planar view using a conventional silicon film as the semiconductor component in substitution for a silicon grain.

FIGS. 18 and 19 are model views when using mainly the fine metal wires themselves for the wiring pattern on the semiconductor component described in the above embodiments. FIG. 18 is a planar view when using the silicon grain as the semiconductor component, and FIG. 19 is a planar view when using a conventional silicon semiconductor component.

Figure 20:
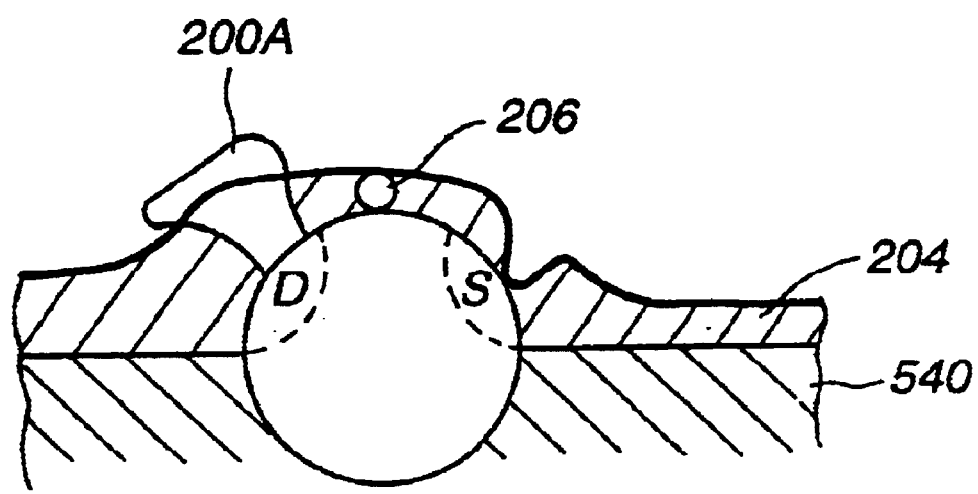
FIG. 20 illustrates the specific construction of the embodiment in FIG. 18.

FIG. 20 illustrates a more specific structure of the present embodiment. A fine metal wire having an insulating coating is provided as a gate line 206 on substantially the tip of the silicon grain. An oxidation film 204 is formed and a drain electrode 200A connecting with the drain area of the silicon grain is connected with such drain area via a contact hole for the drain area. A contact hole connecting with the source area of this silicon grain is formed, and a fine metal wire 204 which is to be the source line is arranged to cross the gate electrode at substantially right angles. This fine metal runs on the insulation film 204, bends toward the source area of the silicon grain within the source contact and connects with the area. Thereafter, the source line exits this contact hole and runs toward the neighboring silicon grain. According to the present embodiment, the fine metal wires for the source line and for the gate line may cross each other, but the gate line insulating cover can prevent short-circuiting of both.

As described above, the transistor component relating to the present embodiment can obtain a transistor component having the desired functions by fixing the insulating substrate, so there is no need to form a semiconductor component on the silicon substrate as with the conventional art, and further, the difficulties of forming a large-size liquid crystal display can be overcome.

Also, according to the method of manufacturing the transistor component relating to the present invention, the transistor component need only be placed at the desired position of where the transistor component should be positioned, so the component separating step and photolithography patterning step etc., required in the conventional method for manufacturing each semiconductor component on the silicon substrate can be omitted.

According to the active matrix substrate for a liquid crystal display relating to the present invention, the difficulties of manufacturing a large-size silicon substrate can be avoided, thereby providing a large-size crystal display at low cost.

Also, according to the method of manufacturing an active matrix substrate for a liquid crystal display relating to the present invention, a transistor component placed on the substrate is fixed via an adhesive agent or the like, so each semiconductor component need not be manufactured on the silicon substrate, simplifying the manufacturing process.

According to the present invention, the wiring pattern for the semiconductor component can use the fine metal wires, so etching processing during the forming of the metal patterns can be omitted.

Also, as the forming of the contact holes forming the insulation film of the semiconductor component was performed by physical means, namely fine cutting and processing tools, the chemical processing such as the etching can be omitted.

What is claimed is:

1. A semiconductor component comprising:
    a plurality of silicon microbulks on an insulating substrate in predetermined pitches in array; and
    electrode patterns on each of said silicon microbulks;
    wherein said silicon microbulks are fixed to said insulating substrate via an adhesive agent.

2. A semiconductor component according to claim 1, wherein the pitches of said silicon microbulks are each formed corresponding to a plurality of pixels.

3. A semiconductor component using the silicon microbulk according to claim 1 as the switching component against each pixel electrode of the active matrix substrate.

4. A transistor component comprising:
    a silicon grain having a drain area and a source area formed via a channel area;
    an oxidation film covering the surface of said silicon grain;
    a gate electrode connecting with said channel area via said oxidation film; and
    a drain electrode connecting with said drain area; and
    a source electrode connecting with said source area.

5. A transistor component according to claim 4, wherein said silicon grain is substantially spherical in shape.

6. A transistor component according to claim 4, wherein said silicon grain is a silicon monocrystal.

7. The transistor component according to claim 4, wherein said oxidation film is made of silicon dioxide.

8. An active matrix substrate for a display wherein a transistor component is structured for each of a plurality of pixel areas defined by data lines and scan lines on an insulating substrate, said transistor component comprising a source area electrically connecting with said data line, a gate electrode electrically connecting with said scan line, and a drain area electrically connecting with a pixel electrode, wherein said transistor component is a transistor component according to claim 1.

9. An active matrix substrate for a display according to claim 8, wherein said transistor component is fixed to said insulating substrate via an adhesive agent.

10. An active matrix substrate for a display according to claim 9, wherein said adhesive agent is coated on said insulating substrate corresponding to the position where said transistor component is to be arranged.

11. An active matrix substrate for a display according to claim 8, wherein said insulating substrate is a plastic substrate.

12. An active matrix substrate for a display according to claim 8, wherein said insulating substrate is a flexible substrate.

13. An active matrix substrate for a display according to claim 8, wherein said insulating substrate has a heat resistance of 200° C. or less.

14. A semiconductor device using fine metal wires for forming a wiring pattern on a semiconductor component, a metal wire for bonding wires used as said fine metal wires, wherein said fine metal wire is used as a gate line and/or source line of said semiconductor component.

15. A semiconductor device having a contact hole connecting with a source area and another contact hole connecting with a drain area of a silicon grain, the contact holes being formed on an insulation film, wherein said contact holes are cutout formed by said insulation film being selectively cut by a fine cutting means.

16. A transistor component according to claim 7, wherein said silicon oxide film is formed by heat-oxidizing said silicon grain.

17. A semiconductor device according to claim 15, wherein said fine cutting means is a dicing cutter.

* * * * *